US008021564B2

(12) United States Patent
Sakuragi et al.

(10) Patent No.: US 8,021,564 B2
(45) Date of Patent: Sep. 20, 2011

(54) METHOD FOR DETECTING AN END POINT OF RESIST PEELING, METHOD AND APPARATUS FOR PEELING RESIST, AND COMPUTER-READABLE STORAGE MEDIUM

(75) Inventors: Isamu Sakuragi, Nirasaki (JP); Kazuhiro Kubota, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 957 days.

(21) Appl. No.: 11/868,045

(22) Filed: Oct. 5, 2007

(65) Prior Publication Data

US 2008/0083500 A1      Apr. 10, 2008

Related U.S. Application Data

(60) Provisional application No. 60/883,252, filed on Jan. 3, 2007.

(30) Foreign Application Priority Data

Oct. 6, 2006  (JP) ................................. 2006-275404

(51) Int. Cl.
 *G01L 21/30* (2006.01)

(52) U.S. Cl. ................ 216/59; 216/16; 216/49; 216/61; 216/63; 438/706; 438/715; 438/718; 438/722; 438/725

(58) Field of Classification Search .................... 216/16, 216/49, 58, 61, 63, 74, 79; 438/706, 715, 438/718–722
See application file for complete search history.

(56) References Cited

U.S. PATENT DOCUMENTS

| 6,340,253 | B1 * | 1/2002 | Muranaka et al. ............ 396/611 |
| 6,515,493 | B1 * | 2/2003 | Adams et al. ................. 324/716 |
| 6,592,771 | B1 * | 7/2003 | Yamanaka et al. .............. 216/63 |

FOREIGN PATENT DOCUMENTS

| JP | 2000-269187 | 9/2000 |
| JP | 2002-289586 | 10/2002 |
| JP | 2006-270004 | 10/2006 |
| JP | 2007-067309 | 3/2007 |

* cited by examiner

*Primary Examiner* — Shamim Ahmed
*Assistant Examiner* — Maki A Angadi
(74) *Attorney, Agent, or Firm* — Oblon, Spivak, McClelland, Maier & Neustadt, L.L.P.

(57) ABSTRACT

A method for detecting an end point of a resist peeling process in which a resist is gasified to be peeled off by producing hydrogen radicals by catalytic cracking reaction where a hydrogen-containing gas contacts with a high-temperature catalyst, and contacting the produced hydrogen radicals with a resist on a substrate, includes monitoring one or more parameters indicating a state of the catalyst and detecting the end point of the resist peeling process based on variations of the monitored parameters. The hydrogen-containing gas may be a $H_2$ gas. The parameters indicating the state of the catalyst may be one or more electrical parameters when a power is supplied to the catalyst. Further, the catalyst may be a filament made of a high melting point metal.

20 Claims, 5 Drawing Sheets

METHOD FOR DETECTING AN END POINT OF RESIST PEELING, METHOD AND APPARATUS FOR PEELING RESIST, AND COMPUTER-READABLE STORAGE MEDIUM

FIELD OF THE INVENTION

The present invention relates to a method for detecting an end point of a process for peeling a residual resist after a target layer on a substrate such as a semiconductor wafer is etched, and also relates to a resist peeling method including the end point detecting method; a resist peeling apparatus; and a computer-readable storage medium to be used therein.

BACKGROUND OF THE INVENTION

In a manufacturing process of semiconductor devices, a photoresist pattern is formed on a semiconductor wafer, which is a target substrate to be processed, by a photolithograph process, and etching is performed by using the photoresist pattern as a mask. After the etching, the photoresist is peeled off.

In the process of peeling the photoresist, a dry ashing technique or a wet ashing technique is mainly employed. In particular, in peeling a resist which is modified after an injection of ions, the dry ashing technique and the wet ashing technique are both employed. However, if the two ashing techniques are used together, the process becomes complicated and the processing time increases. Moreover, in case of peeling the denaturalized resist, resist residues remain on an underlayer, so another process for removing these resist residues is additionally required.

To solve this problem, Japanese Patent Laid-open Application No. 2002-289586 (Patent Reference) discloses a technique for peeling a resist, in which atomic hydrogens (hydrogen radicals) is produced by a catalytic cracking reaction between a peeling gas containing molecules with hydrogen atoms and a heated catalyst with a high melting point and, and the produced atomic hydrogens (hydrogen radicals) contacts with the resist, so that the resist is gasified and is finally removed. By this technique, the resist can be peeled off through a simple process, while it is also possible to clean the surface of the underlayer after the peeling of the resist.

In the resist peeling process, detection of an end point is required in order not to cause any damage on the underlayer. In the conventional dry ashing method using plasma, an end point detecting technique of detecting an end point by inspecting a plasma state is established, for example. However, in case of the technique of peeling the resist with the atomic hydrogens produced by using the catalyst as disclosed in the Patent Reference, no method for detecting the end point has been known so far.

SUMMARY OF THE INVENTION

In view of the above, the present invention provides an end point detecting method capable of detecting an end point exactly in a technique of peeling a resist by using a catalyst. Further, it is another object of the present invention to provide a resist peeling method including this end point detecting method; a resist peeling apparatus; and a computer-readable storage medium storing therein a program for use in executing the resist peeling method.

In accordance with one aspect of the present invention, there is provided a method for detecting an end point of a resist peeling process in which a resist is gasified to be peeled off by producing hydrogen radicals by catalytic cracking reaction where a hydrogen-containing gas contacts with a high-temperature catalyst, and contacting the produced hydrogen radicals with the resist on a substrate, the method including: monitoring one or more parameters indicating a state of the catalyst; and detecting the end point of the resist peeling process based on variations of the monitored parameters.

In accordance with another aspect of the present invention, there is provided a resist peeling method including: producing hydrogen radicals from a catalytic cracking reaction where a hydrogen-containing gas contacts with a high-temperature catalyst; gasifying to peel off a resist on a substrate by contacting the produced hydrogen radicals with the resist; and monitoring one or more parameters indicating a state of the catalyst and detecting an end point of the resist peeling based on variations of the parameters.

In accordance with still another aspect of the present invention, there is provided a resist peeling apparatus including: a processing vessel for accommodating therein a substrate having a resist; a catalyst disposed in the processing vessel; a heating unit for heating the catalyst; a gas supplying unit for supplying a hydrogen-containing gas into the processing vessel; and a monitor unit for monitoring one or more parameters indicating a state of the catalyst heated by the heating unit up to a high temperature.

In the processing vessel, hydrogen radicals are produced from a catalytic cracking reaction where the hydrogen-containing gas contacts with the catalyst of the high temperature, and the produced hydrogen radicals contact with the resist on the substrate so that the resist is gasified and peeled off. An end point of the resist peeling is detected based on variations of the one or more parameters indicating the state of the catalyst monitored by the monitor unit.

In above aspects of the present invention, it is preferable that the hydrogen-containing gas is a $H_2$ gas. Further, it is also preferable that the parameters indicating a state of the catalyst is one or more electrical parameters when a power is supplied to the catalyst. The electrical parameter may be at least one of a voltage, a current and a power. Further, the electrical parameter may be a current which flows into the catalyst when a constant voltage is applied to the catalyst or may be a voltage of the catalyst when a constant current flows into the catalyst.

It is also preferable that the parameter indicating the state of the catalyst is a temperature of the catalyst or it may be a location of the catalyst. Further, the catalyst may be a filament made of a high melting point metal.

In accordance with still another aspect of the present invention, there is provided a computer readable storage medium for storing therein a computer executable control program, wherein, when executed on a computer, the control program controls the resist peeling apparatus to perform the resist peeling method.

In accordance with the present invention, when a resist peeling process in which a resist is gasified to be peeled off is performed by producing hydrogen radicals from catalytic cracking reaction where a hydrogen-containing gas contacts with a high-temperature catalyst, and contacting the produced hydrogen radicals with the resist on a substrate, one or more parameters indicating a state of the catalyst are monitored and detecting the end point of the resist peeling process is detected based on variations of the monitored parameters. Therefore, the end point can be detected exactly. In other words, when the resist peeling is completed, reaction products are not produced any more so that a gas state around the catalyst is also changed. As a result, a temperature of the catalyst or electrical parameters of the conducted catalyst is changed. Therefore, by monitoring the parameters concerning the state of the catalyst, the end point of the resist peeling can be exactly detected.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, an embodiment of the present invention will be described in detail with reference to the accompanying drawings.

Figure 1:
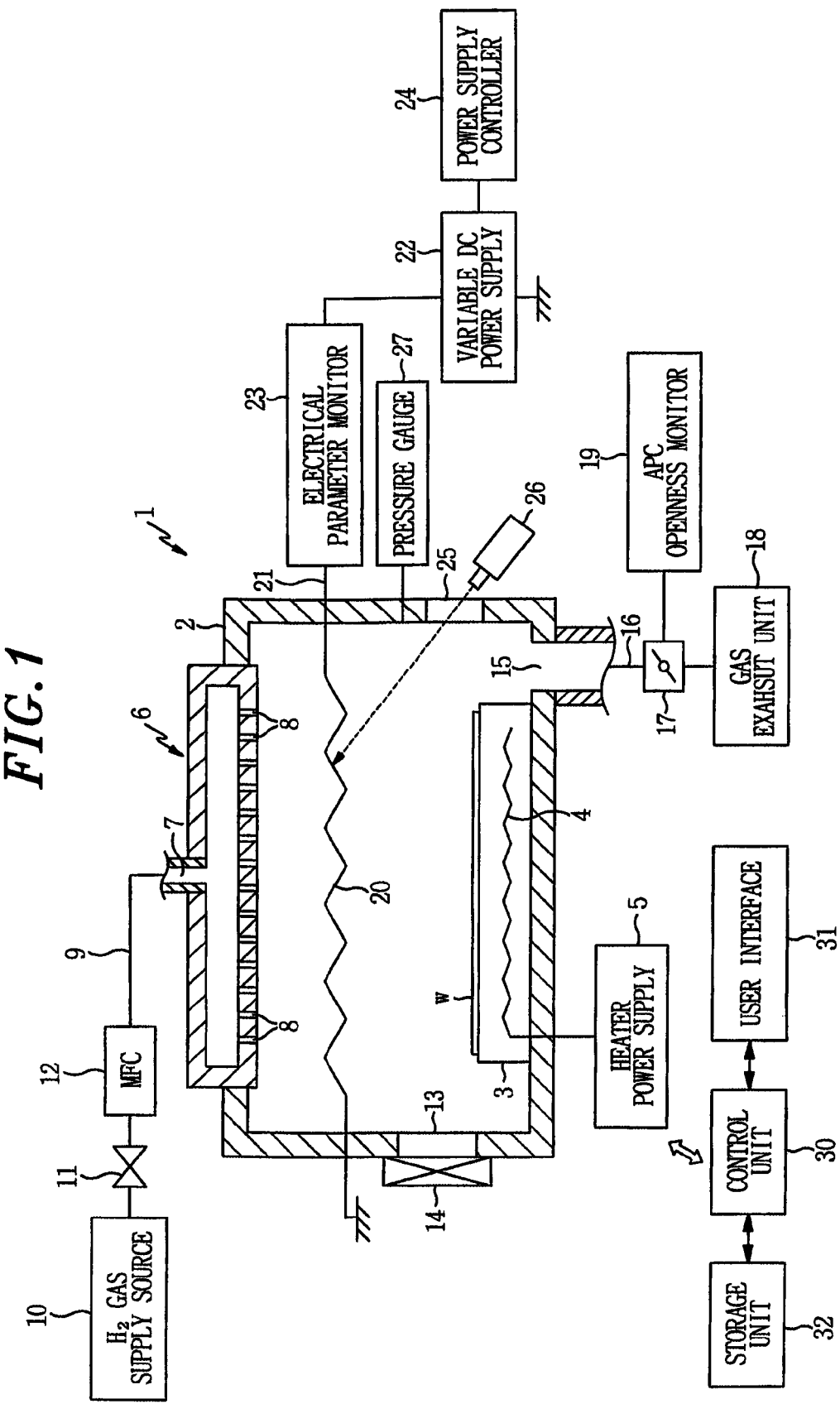
FIG. 1 is a schematic cross sectional view showing an exemplary resist peeling apparatus for use in performing an embodiment of the present invention.

FIG. 1 is a cross sectional view showing an exemplary resist peeling apparatus for use in the performing the embodiment of the present invention.

A resist peeling apparatus 1 includes a vacuum evacuable cylindrical chamber 2. Provided at a bottom portion of the chamber 2 is a susceptor 3 for mounting thereon a semiconductor wafer W which is a target substrate having thereon a resist film to be peeled off. A heater 4 for heating the semiconductor wafer W mounted on the susceptor 3 is buried inside the susceptor 3. A heater power supply 5 supplies a power to the heater 4.

A hollow disk-shaped shower head 6 for introducing an $H_2$ gas serving as a peeling gas into the chamber 2 is provided at a ceiling portion of the chamber 2, while facing the susceptor 3. The shower head 6 has a gas inlet port 7 at the center of a top surface thereof and is provided with a number of gas injection openings 8 in a bottom surface thereof.

One end of a gas supply line 9 is connected to the gas inlet port 7, and the other end of the gas supply line 9 is coupled to an $H_2$ gas supply source 10 for supplying the $H_2$ gas as the peeling gas. Further, an opening/closing valve 11 and a mass flow controller (MFC) 12 for controlling the flow rate of the $H_2$ gas are installed on the gas supply line 9. The peeling gas is not limited to the $H_2$ gas, but can be any gas containing hydrogen which is capable of producing hydrogen radicals (atomic hydrogens) when contacting with a high-temperature catalyst wire 20 to be descried later can be used as. For example, $SiH_4$, $CH_4$, $NH_3$, or the like can be utilized.

A loading/unloading port 13 through which the semiconductor wafer W is loaded into or unloaded from the chamber 2 is provided at a sidewall of the chamber 2. The loading/unloading port 13 is opened or closed by a gate valve 14. Further, a gas exhaust port 15 is provided at a bottom portion of the chamber 2, and a gas exhaust line 16 is connected to the gas exhaust port 15. A gas exhaust unit 18 including an automatic pressure controller (APC) 17 and a vacuum pump such as a Turbomolecular pump is connected to the gas exhaust line 16. The openness degree of the APC 17 can be monitored by an APC openness degree monitor 19. The internal pressure of the chamber 2 can be detected by a pressure gauge 27, and the openness degree of the APC 17 is controlled based on the detection result of the pressure gauge 27.

The catalyst wire 20 made of a conductive refractory material, e.g., tungsten, is provided between the susceptor 3 and the shower head 6 inside the chamber 2. One end of the catalyst wire 20 is connected to a power supply line 21 which is connected to a variable DC power supply 22, while the other end of the catalyst wire 20 is grounded. Installed on the power supply line 21 is an electrical parameter monitor 23 which serves to monitor electrical parameters such as a voltage, a current, a power, and the like. Further, the variable DC power supply 22 is controlled by a power supply controller 24. Here, the material of the catalyst wire 20 is not limited to the tungsten but any other heat-resistant material capable of being heated up to a high temperature can be employed. For example, Pt, Ta, Mo, or the like can be used.

At a sidewall of the chamber 2 opposite to where the loading/unloading port 13 is located, there is provided a window 25 through which the inside of the chamber can be seen. Further, a radiation pyrometer 26 for detecting the temperature of the catalyst wire 20 is disposed outside the window 25.

Each component of the resist peeling apparatus 1, e.g., a supply unit of the $H_2$ gas used as the peeling gas (the valve 11, the mass flow controller 12, and the like), the heater power supply 5, the power supply controller 24, and the APC 17, is connected to and controlled by a control unit 30 (for controlling the entire apparatus) having a micro processor (computer). The controller 30 receives information such as a monitoring signal from the electrical parameter monitor 23 and a temperature signal from the radiation pyrometer 26. Further, a user interface 31 is connected to the control unit 30, wherein the user interface 31 includes, e.g., a keyboard for a process manager to input a command to operate the resist peeling apparatus 1, a displayer for showing an operational status of the plasma processing apparatus 1, and the like.

Moreover, connected to the control unit 30 is a storage unit 32 for storing therein, e.g., control programs to be used for carrying out various processes, which are performed in the resist peeling apparatus 1 under the control of the control unit 30, and programs or recipes to be used to operate each component of the resist peeling apparatus 1 to carry out processes depending on processing conditions. The recipes are stored in a storage medium in the storage unit 32. The storage medium may be a hard disk or a semiconductor memory, or may be a portable device such as CDROM, DVD, flash memory, or the like.

When a command or the like is inputted through the user interface 31, the control unit 30 retrieves a necessary recipe from the storage unit 32 and executes the recipe, whereby a desired process in the resist peeling apparatus 1 is performed under the control of the control unit 30.

Hereinafter, a resist peeling operation performed by the resist peeling apparatus having the above-described configuration will be explained.

Figure 2:
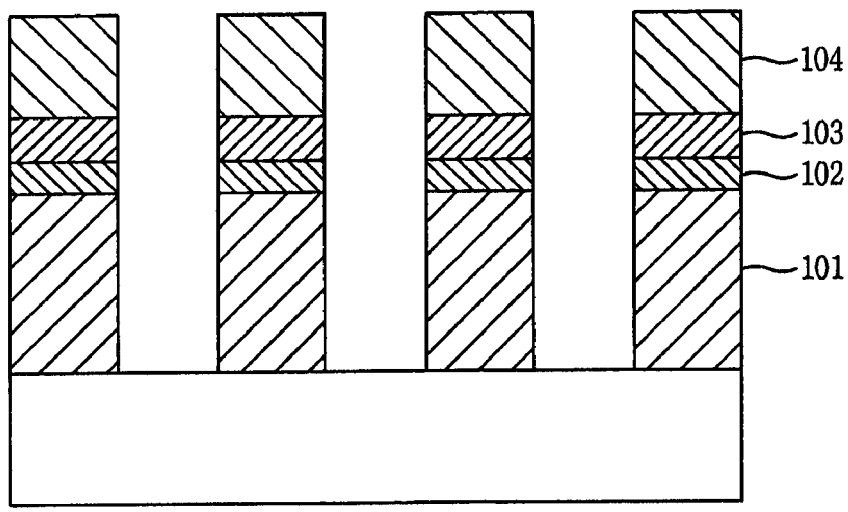
FIG. 2 sets forth a cross sectional view showing a structure of a semiconductor wafer W used in performing a resist peeling method in accordance with the embodiment of the present invention.

Here, as shown in FIG. 2, a semiconductor wafer W to be processed having, e.g., a SiCO-based low-k film 101 as an etching target layer, a cap (SiO$_2$) film 1 formed on the low-k film 101, a bottom antireflection coating (BARC) film 103 formed on the cap film 102, and a resist film 104 formed on the BARC film 103, wherein the low-k film 101 is etched to form a specific pattern therein by using the resist film 104 as a mask is provided to the embodiment. In this embodiment, by using this sample having the above structure, the resist film 104 and the BARC film 103 are peeled off.

First, a gate valve 14 is opened, and the semiconductor wafer W etched as described above is loaded into the chamber 2 through the loading/unloading port 13 and mounted on the susceptor 3. In this state, the gas exhaust unit 18 is operated to make the internal pressure of the chamber 2 to be at a specific pressure level (vacuum level), based on the measured value of pressure gauge 27, under the control of the APC 17. At the same time, the heater 4 generates heats by using the heater power supply 5, whereby the semiconductor wafer W loaded on the susceptor 3 is heated up to a specific temperature.

Meanwhile, the catalyst wire 20 is powered by the variable power supply 22 to be heated up to a high temperature ranging from about 1400 to 2000° C., preferably. At this time, the temperature of the catalyst wire 20 is detected by the radiation pyrometer 26.

When the catalyst wire 20 is heated up to the high temperature, an H$_2$ gas is introduced from the H$_2$ gas supply source 10 into the chamber 2 through the gas supply line 9 and the shower head 6. The flow rate of the H$_2$ gas at this time is properly set depending on, e.g., a type and an amount of the resist to be peeled off. For example, the flow rate of the H$_2$ gas is set to range from about 200 to 1000 mL/min (sccm).

Figure 3:
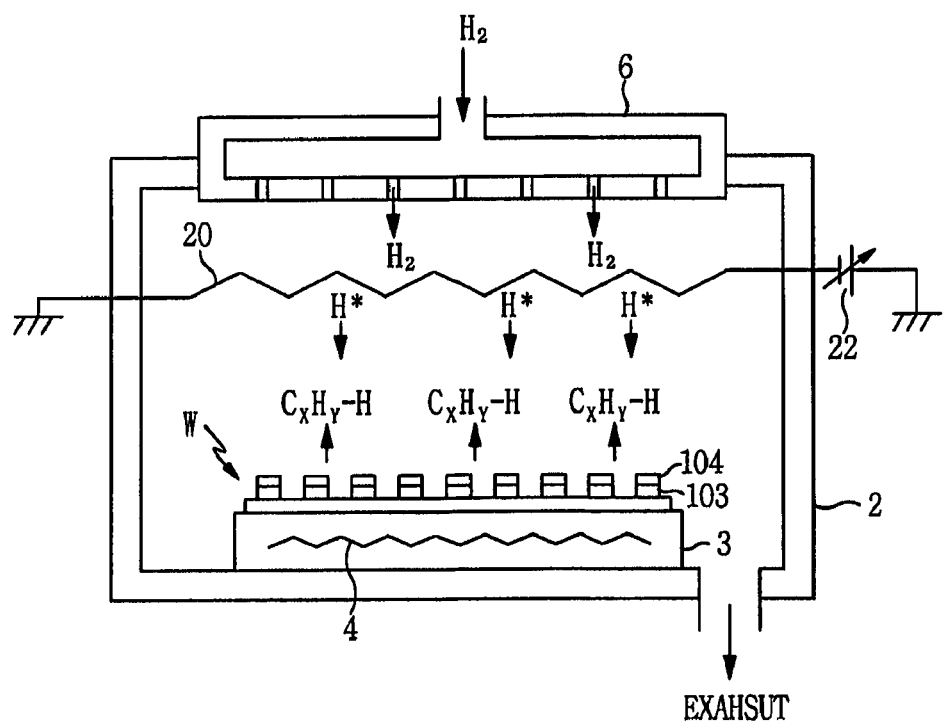
FIG. 3 provides a schematic view describing a gas state inside a chamber while a peeling process is being performed by the resist peeling apparatus of FIG. 1.

When the H$_2$ gas contacts the catalyst wire 20 heated up to the high temperature equal to or higher than about 1400° C., the H$_2$ gas is excited in a catalytic cracking reaction, so that hydrogen radicals (atomic hydrogens) H* are produced, as illustrated in FIG. 3. By the produced hydrogen radicals contacting with the resist film 104 of the semiconductor wafer W, the resist film 104 is gasified to be peeled off. At this time, the resist film 104 is decomposed, and, as a result, components depending on the composition of the resist film (hereinafter, simply referred to as a "resist-dependent component") (briefly identified as C$_x$H$_y$—H in FIG. 3) exist in the chamber 2. By setting the temperature of the semiconductor wafer W at about 250° C. to 230° C., the resist peeling reaction and the like can be accelerated. Here, since the semiconductor wafer W is heated by a radiant heat from the catalyst wire 20 as well as by the heater 4, the above-specified temperature range of the semiconductor wafer W can be achieved by heating the susceptor 3 with the heater 4 at a temperature of about 175° C. to 280° C.

As the peeling process is performed as described above, the resist film 104 and the BRAC film 103 having the similar components as that of the resist film 104 are decomposed to be finally removed. This peeling process is required to be ended at a point where the resist film 104 and the BRAC film 103 are all removed. Conventionally, there is proposed no method of detecting this end point. That is, when the resist peeling is performed by a plasma ashing process widely employed in the prior art, the end point of the process can be readily detected by way of monitoring a plasma emission state and detecting variation in the plasma emission state when the resist film is peeled off. However, in the present resist peeling technique using the catalyst which the present invention is related to, this conventional end point detecting method using the plasma state cannot be employed because no plasma is generated in this technique so that it has been difficult to detect the end point of the resist peeling process precisely.

Figure 4:
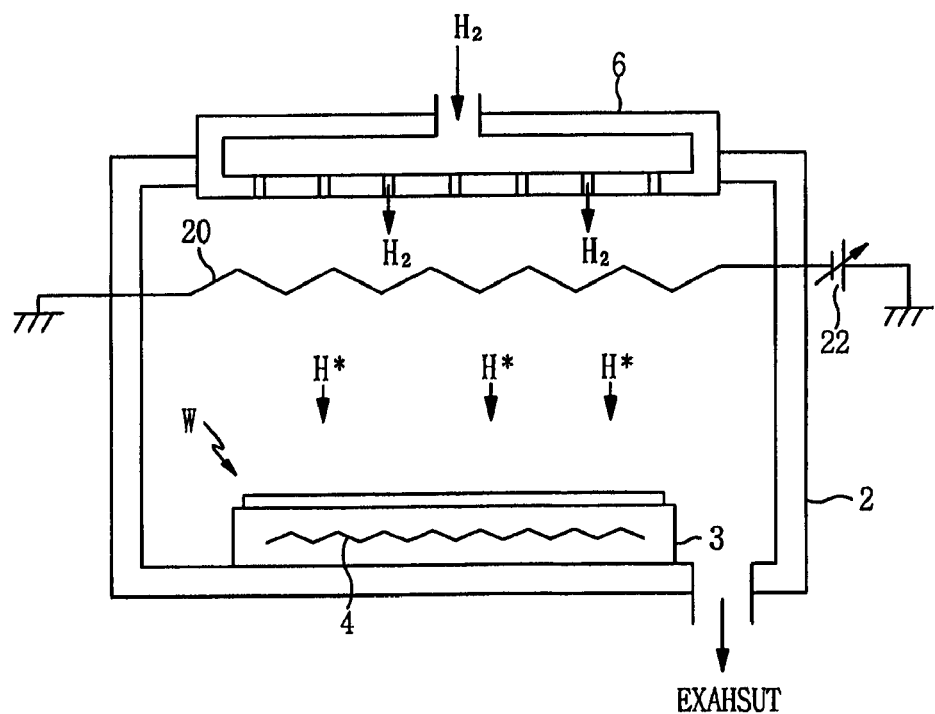
FIG. 4 presents a schematic view describing a gas state inside the chamber when the peeling process is completed by the resist peeling apparatus of FIG. 1.

Therefore, in this embodiment, parameters indicating a state of the catalyst wire 20 are monitored while the resist film 104 and the BARC film 103 are being peeled off, and, the end point of the resist peeling process is detected based on the variations in the parameters. To be specific, though the resist-dependent component exists in the chamber 2 while the resist peeling reaction is taking place as described above, this gas is not generated any more after the resist peeling (in this embodiment, the peeing of the resist film 104 and the BRAC film 103) is completed. As a result, the H$_2$ gas and the hydrogen radicals (H*) mainly exist in the chamber 2 after the completion of the resist peeling, as shown in FIG. 4. Due to this variation of the gas state inside the chamber 2, the state of the catalyst wire 20 is also changed. Specifically, the H$_2$ gas is known to have a higher thermal conductivity than that of the resist-dependent component. Thus, since the H$_2$ gas and the hydrogen radicals H* mainly fill the chamber 2 as afore mentioned, the thermal conductivity of the gas inside the chamber 2 increases, so that the temperature of the catalyst wire 20 is varied, thereby the electrical parameter of the catalyst wire 20 being varied when a power is supplied thereto. Further, the variation of the gas state inside the chamber 2 also results in a change of the location of the catalyst wire 20.

Accordingly, by monitoring the parameter indicating the state of the catalyst wire 20, the end point of the peeling process can be detected. Specifically, an increase of the thermal conductivity of the gas inside the chamber 2 results in a decrease of the temperature of the catalyst wire 20, and such temperature reduction in turn results in a reduction of an electrical resistance of the catalyst wire 20. Therefore, by monitoring electrical parameters when a power is supplied to the catalyst wire 20, such as a current, a voltage, a power, and the like, by means of the electrical parameter monitor 23 and detecting the variations in the parameters, the end point at the peeling process is detected.

For example, in the event that a constant voltage is applied to the catalyst wire 20, the thermal conductivity of the gas inside the chamber 2 increases, resulting in a decrease of the electrical resistance of the catalyst wire 20, whereby the currents flowing in the catalyst wire 20 increases. Therefore, by monitoring the currents value flowing into the catalyst wire 20, a point when the current is increased by a certain level can be detected as the end point of the peeling process. In case of using a voltage value, the same end point detection mechanism is available. Further, in the event that the current flowing in the catalyst wire 20 is set constant, the voltage decreases as a result of the reduction of the electrical resistance of the catalyst wire 20. Accordingly, by monitoring the voltage value, the moment when the voltage value is reduced by a certain level can be detected as the end point of the peeling process. Alternatively, since the voltage of the catalyst wire 20 is varied, it is also possible to monitor the voltage value or a power and to detect the moment when this parameter is varied by a certain amount as the end point of the resist peeling process.

When a temperature is served as a parameter indicating the state of the catalyst wire 20, the temperature of the catalyst wire 20 is monitored by using the radiation pyrometer 26. The point when the temperature is reduced by a specific amount is detected as the end point of the resist peeling process.

Moreover, since the location of the catalyst wire 20 is also changed as the gas state inside the chamber 2 is varied, it is possible to detect the end point of the resist peeling by monitoring the variation of the location of the catalyst wire 20 through an optical device such as a camera or the like.

Furthermore, since the radiation pyrometer 26 measures the temperature of a target object by radiating infrared rays thereto, a measurement position at the catalyst wire is also changed when there is a change in the location of the catalyst wire 20. Thus, in case the gas state inside the chamber 2 is varied, the temperature measurement value reflects both the temperature variation and the location variation of the catalyst wire 20, so there will be a great variation in the temperature measurement value.

As described, when performing the resist peeling by using the catalyst wire 20, the parameters indicating the state of the catalyst wire 20 are monitored. Therefore, the end point of the resist peeling can be exactly detected based on variations of such parameters that are caused by the changed gas state inside the chamber 2 when the peeling of the resist is finished.

Further, the end point of the peeling process can also be detected by way of directly detecting the variation of the gas state inside the chamber 2 which the end of the peeling process brings with. For example, if the peeling process is finished and no more resist-dependent component is produced, the internal pressure of the chamber 2 is changed. As a result, monitoring values of the APC openness degree monitor 19 and the pressure gauge 27 are changed so that the end point of the peeling process can be detected by detecting the changed monitoring values.

Moreover, since the gas state inside the chamber 2 is also changed when the peeling process begins, an initial time of the peeling process may be detected by monitoring the parameters indicating the catalyst state as mentioned above.

Now, a result of experiments for investigating effects of the present method will be explained.

Figure 5:
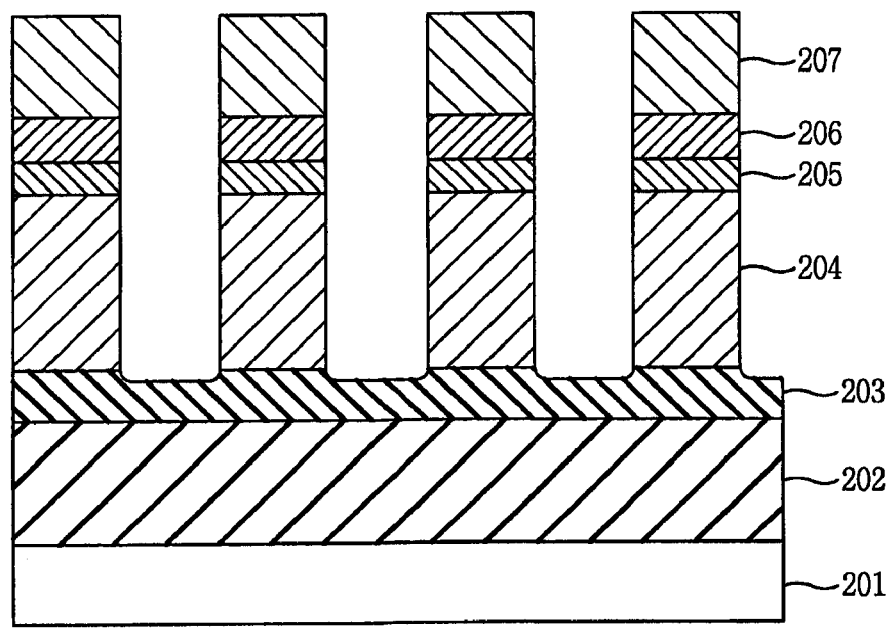
FIG. 5 depicts a cross sectional view showing a sample structure used in an experimental peeling process.

In this experiment, as shown in FIG. 5, a sample was prepared as: piling on a Si substrate 201, an $SiO_2$ film 202, a SiC film 203 as an etching stop film, as the low-k film of porous MSQ (methyl-hydrogen-SilsesQuioxane) film 204, a $SiO_2$ cap film 205, an organic BARC film 206, and an ArF resist film 205 in succession, forming patterns in the ArF resist film 207 by a photolithography process, and then, etching the porous MSQ film 204 by using the ArF resist film 207 as a mask. Then, with this sample, a peeling process for peeling off the ArF resist film 207 and the organic BARC film 206 was performed by using the resist peeling apparatus of FIG. 1. The thicknesses of the porous MSQ film 204, the $SiO_2$ cap film 205, the organic BARC film 206 and the ArF resist film 207 were 100 nm, 60 nm, 60 nm and 70 nm, respectively.

For the peeling process, a $H_2$ gas is supplied at a flow rate of 600 mL/min (sccm) while the internal pressure of the chamber 2 was set to be 66.7 Pa (500 mTorr), and, a constant voltage of 48.3 V was applied to the catalyst wire 20 made of tungsten so that the temperature of the catalyst wire 20 was regulated at 1450° C. Further, the temperature of the susceptor 3 heated by the heater 4 was set to 250° C. in order to set the temperature of the sample to be 300° C.

Figure 6:
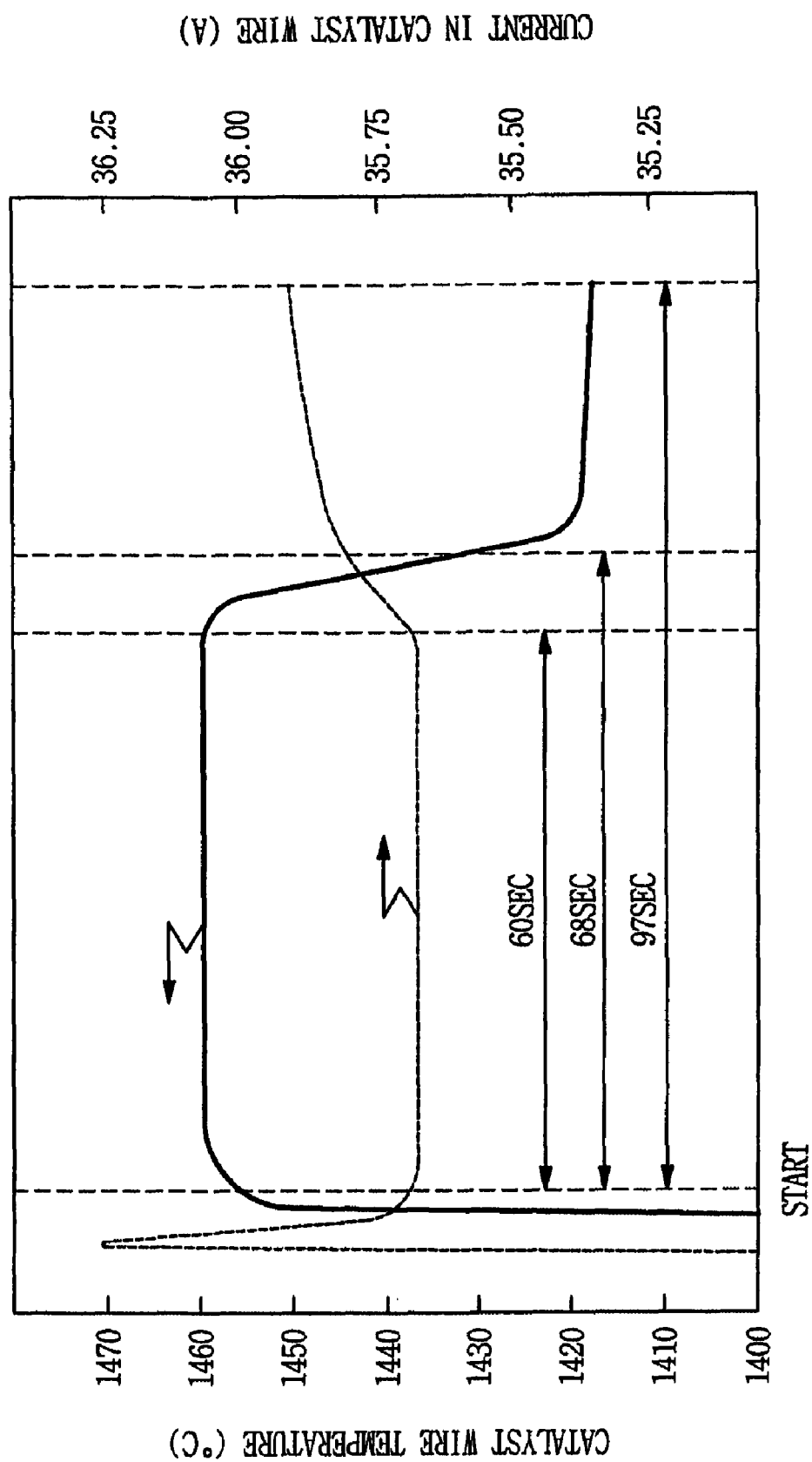
FIG. 6 offers a graph showing monitoring results of a temperature and a current of a catalyst wire, which are obtained from an experimental peeling process.

During the peeling process, a current of the catalyst wire 20 and a temperature of the catalyst wire 26 measured by the radiation pyrometer 26 were monitored. The result is provided in FIG. 6. As can be seen from FIG. 6, upon the beginning of the peeling process, the temperature and the current value of the catalyst wire 20 reached to respective constant values not before long. However, with a lapse of 60 seconds after the peeling process starts, the temperature started to decrease so that the current started to increase. The monitoring of the temperature and the current was continued for 97 seconds. After the 60 seconds elapsed, the current value continued to increase and the temperature decreased rapidly until about 70 seconds elapsed, but, after then, there was almost no change in the temperature.

Figure 7A:
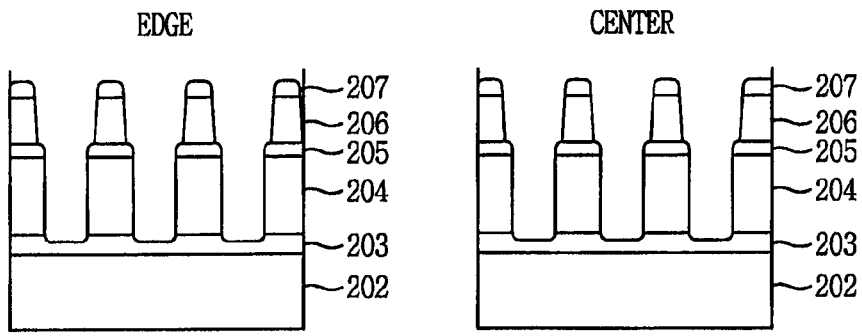
FIGS. 7A to 7D are cross sectional views schematically showing variations of a sample state as time elapses while the experimental peeling process is being performed.
Figure 7B:
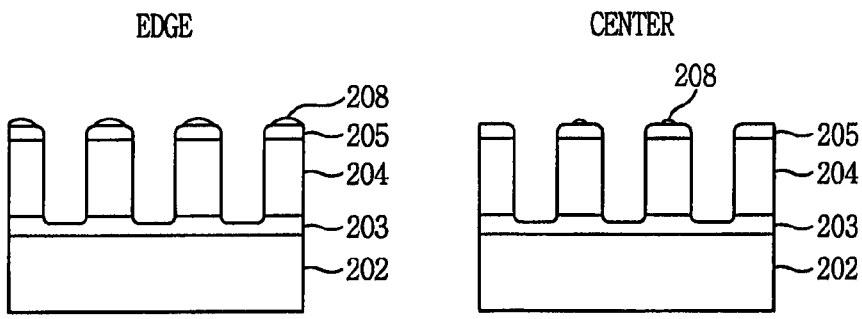
Figure 7C:
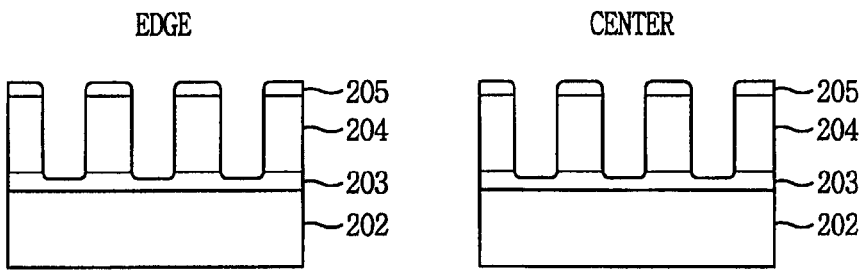
Figure 7D:
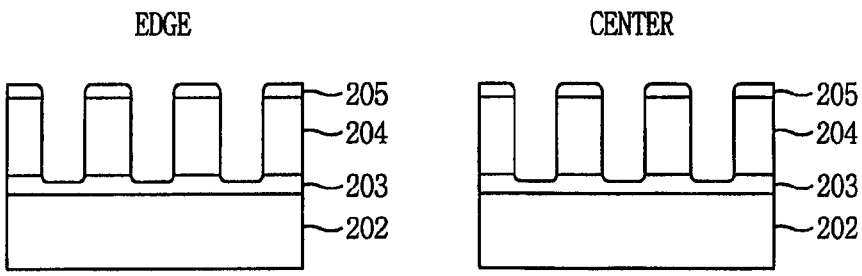

Then, the cross section of the semiconductor wafer sample was observed at each time, and the result is provided in FIGS. 7A to 7D. FIG. 7A shows a state before the resist peeling starts, wherein residues of the organic BARC film 206 and the ArF resist film 207 remain. FIG. 7B shows a state after the lapse of 60 seconds from the beginning of the peeling process, at which time the temperature of the catalyst wire 20 starts to decrease while the current value thereof starts to increase as afore mentioned, wherein some resist residues 208 left after the peeling are shown to be present on the $SiO_2$ cap film 205. FIG. 7C shows a state after the lapse of 68 seconds from the beginning of the peeling process, wherein no resist residue exists and the peeling process is completely finished. FIG. 7D shows a state after the lapse of 97 seconds from the beginning of the peeling process, which shows the almost same state as that in FIG. 7C.

From this result, it is confirmed that the end point of the peeling process can be detected by monitoring variations of the parameters indicating the state of the catalyst wire 20, i.e., the temperature and the current value of the catalyst wire 20.

Here, it is to be noted that the present invention can be modified in various ways. For example, though the above embodiment has been described for the case of using the low-k film as the etching target layer, the present invention is not limited thereto. Further, in this embodiment, the BARC film was used so both the resist film and the BARC film were peeled off by the peeling process but the BARC film is not essentially used. Moreover, though the semiconductor wafer was the target substrate to be processed in the aforementioned embodiment, other types of substrates can be employed instead.

While the invention has been shown and described with respect to the embodiments, it will be understood by those skilled in the art that various changes and modifications may be made without departing from the scope of the invention as defined in the following claims.

What is claimed is:

1. A method for detecting an end point of a resist peeling process in which a resist on a substrate in a chamber is peeled off, the method comprising:
    producing hydrogen radicals by catalytic cracking reaction where a hydrogen-containing gas contacts with a high-temperature catalyst;
    gasifying and peeling off the resist by contacting the produced hydrogen radicals with the resist;
    monitoring one or more parameters indicating a state of the catalyst; and
    detecting an end point of the resist peeling process based on variations of the monitored parameters,
    wherein the parameters include at least one of a current flowing into the catalyst, a voltage applied to the catalyst, a power supplied to the catalyst, a location of the catalyst, a temperature of the catalyst, and a pressure in the chamber.

2. The method of claim 1, wherein the hydrogen-containing gas is a $H_2$ gas.

3. The method of claim 1, wherein the parameters include the current, the current being obtained when a constant voltage is applied to the catalyst.

4. The method of claim 1, wherein the parameters include the voltage, the voltage being obtained when a constant current flows into the catalyst.

5. The method of claim 1, wherein the catalyst is a wire made of a high melting point metal.

6. The method of claim 1, wherein the parameters include the current.

7. The method of claim 1, wherein the parameters include the voltage.

8. The method of claim 1, wherein the parameters include the power.

9. The method of claim 1, wherein the parameters include the location.

10. The method of claim 1, wherein the parameters include the pressure.

11. A resist peeling method for peeling off a resist on a substrate in a chamber, comprising:
    producing hydrogen radicals from a catalytic cracking reaction where a hydrogen-containing gas contacts with a high-temperature catalyst;
    gasifying and peeling off resist by contacting the produced hydrogen radicals with the resist;
    monitoring one or more parameters indicating a state of the catalyst; and
    detecting an end point of the resist peeling based on variations of the parameters,
    wherein the parameters include at least one of a current flowing into the catalyst, a voltage applied to the catalyst, a power supplied to the catalyst, a location of the catalyst, a temperature of the catalyst, and a pressure in the chamber.

12. The resist peeling method of claim 11, wherein the parameters include the current, the current being obtained when a constant voltage is applied to the catalyst.

13. The resist peeling method of claim 11, wherein the parameters include the voltage, the voltage being obtained when a constant current flows into the catalyst.

14. The resist peeling method of claim 11, wherein the hydrogen-containing gas is a $H_2$ gas.

15. The resist peeling method of claim 11, wherein the catalyst is a wire made of a high melting point metal.

16. The resist peeling method of claim 11, wherein the catalyst is made of a conductive refractory material selected from the group of W, Pt, Ta, and Mo.

17. The resist peeling method of claim 11, wherein the parameters include the current.

18. The resist peeling method of claim 11, wherein the parameters include the voltage.

19. The resist peeling method of claim 11, wherein the parameters include the power.

20. The resist peeling method of claim 11, wherein the parameters include the location.

* * * * *